United States Patent
Kunimoto et al.

(10) Patent No.: US 9,412,687 B2
(45) Date of Patent: Aug. 9, 2016

(54) WIRING SUBSTRATE AND METHOD OF MANUFACTURING THE SAME

(71) Applicant: SHINKO ELECTRIC INDUSTRIES CO., LTD., Nagano-shi, Nagano (JP)

(72) Inventors: Yuji Kunimoto, Nagano (JP); Jun Furuichi, Nagano (JP); Noriyoshi Shimizu, Nagano (JP); Naoyuki Koizumi, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/734,395

(22) Filed: Jun. 9, 2015

(65) Prior Publication Data

US 2015/0364405 A1 Dec. 17, 2015

(30) Foreign Application Priority Data

Jun. 13, 2014 (JP) ................................ 2014-122705

(51) Int. Cl.
| | |
|---|---|
| H05K 1/11 | (2006.01) |
| H01L 23/498 | (2006.01) |
| H05K 3/00 | (2006.01) |
| H05K 3/46 | (2006.01) |
| H05K 3/42 | (2006.01) |

(52) U.S. Cl.
CPC .... *H01L 23/49811* (2013.01); *H01L 23/49827* (2013.01); *H01L 23/49833* (2013.01); *H01L 23/49838* (2013.01); *H05K 3/0047* (2013.01); *H05K 3/4602* (2013.01); *H01L 2224/16225* (2013.01); *H01L 2224/32225* (2013.01); *H01L 2224/73204* (2013.01); *H01L 2924/15192* (2013.01); *H01L 2924/15311* (2013.01); *H05K 3/422* (2013.01); *H05K 2201/096* (2013.01)

(58) Field of Classification Search
None
See application file for complete search history.

(56) References Cited

U.S. PATENT DOCUMENTS

| | | | | | |
|---|---|---|---|---|---|
| 5,510,758 | A | * | 4/1996 | Fujita | H01L 24/17 257/728 |
| 5,635,761 | A | * | 6/1997 | Cao | H01L 23/5383 257/684 |
| 5,726,863 | A | * | 3/1998 | Nakayama | H05K 1/0218 174/255 |
| 6,479,758 | B1 | * | 11/2002 | Arima | H01L 23/49838 174/260 |
| 2002/0181185 | A1 | * | 12/2002 | Kabumoto | H01L 23/49822 361/306.3 |
| 2014/0291005 | A1 | * | 10/2014 | Fukushima | H05K 3/4602 174/262 |

FOREIGN PATENT DOCUMENTS

| | | |
|---|---|---|
| JP | 2003-023252 | 1/2003 |
| JP | 2003-023253 | 1/2003 |

* cited by examiner

*Primary Examiner* — Steven T Sawyer
(74) *Attorney, Agent, or Firm* — Rankin, Hill & Clark LLP

(57) ABSTRACT

A wiring substrate includes a first wiring layer including a first wiring part having a first wiring interval and a second wiring part having a second wiring interval wider than the first wiring interval, a metal plane layer formed on a portion of a first insulation layer formed on the first wiring layer, the first wiring part being located below the portion, a second insulation layer formed on the first insulation layer and the metal plane layer and having a first via hole and a second via hole, a second wiring layer formed on the second insulation layer and connected to the first wiring layer via a first via conductor formed in the first via hole, and a third wiring layer formed on the second insulation layer and connected to the metal plane layer via a second via conductor formed in the second via hole.

6 Claims, 14 Drawing Sheets

WIRING SUBSTRATE AND METHOD OF MANUFACTURING THE SAME

CROSS-REFERENCE TO RELATED APPLICATION

The present application claims priority from Japanese Patent Application No. 2014-122705 filed on Jun. 13, 2014, the entire content of which is incorporated herein by reference.

BACKGROUND

1. Technical Field

The present disclosure relates to a wiring substrate and a method of manufacturing the same.

2. Related Art

In the related art, a wiring substrate for mounting electronic components such as semiconductor devices has been known. In recent years, as the electronic components have been made to have high performance, the wiring substrate has been highly densified and multi-layered.

[Patent Document 1] Japanese Patent Application Publication No. 2003-23252A
[Patent Document 2] Japanese Patent Application Publication No. 2003-23253A As described in a preliminary example, which will be described later, the wiring substrate is formed with a metal plane layer above or below a fine wiring layer so as to suppress crosstalk between patterns of the wiring layer. The metal plane layer is inserted, so that the number of stacked layers of a multi-layered wiring having a stacked via structure is increased by one layer, which decreases the manufacturing yield and increases the cost.

SUMMARY

Exemplary embodiments of the invention provide a wiring substrate having a metal plane layer capable of reducing the cost and a manufacturing method thereof.

A wiring substrate according to an exemplary embodiment of the invention comprises:
a first wiring layer including a first wiring part having a first wiring interval and a second wiring part having a second wiring interval wider than the first wiring interval;
a first insulation layer formed on the first wiring layer;
a metal plane layer formed on a portion of the first insulation layer, the first wiring part being located below the portion;
a second insulation layer formed on the first insulation layer and the metal plane layer;
a first via hole extending from an upper surface of the second insulation layer to the first wiring layer;
a first via conductor formed in the first via hole;
a second via hole formed in the second insulation layer and reaching the metal plane layer;
a second via conductor formed in the second via hole;
a second wiring layer formed on the second insulation layer and connected to the first wiring layer via the first via conductor, and
a third wiring layer formed on the second insulation layer and connected to the metal plane layer via the second via conductor.

A method of manufacturing a wiring substrate according to an exemplary embodiment of the invention comprises:
preparing a wiring member comprising a first wiring layer including a first wiring part having a first wiring interval and a second wiring part having a second wiring interval wider than the first wiring interval;
forming a first insulation layer having an opening arranged on a connection part of the first wiring layer;
forming a metal plane layer on a portion of the first insulation layer, the first wiring part being located below the portion;
forming a second insulation layer including a first via hole and a second via hole on the first insulation layer and the metal plane layer, the first via hole being arranged in the opening of the first insulation layer and the second via hole being arranged on the metal plane layer, and
forming a second wiring layer and a third wiring layer on the second insulation layer, the second wiring layer being connected to the first wiring layer via a first via conductor in the first via hole, and the third wiring layer being connected to the metal plane layer via a second via conductor in the second via hole.

According to following disclosures, the wiring substrate has the metal plane layer for suppressing crosstalk, which is arranged only in a region corresponding to the wiring part having a narrow wiring interval of the first wiring layer. Thereby, when forming the metal plane layer, a via receiving structure for establishing a stacked via structure is omitted.

The first wiring layer below the metal plane layer and the second wiring layer above the metal plane layer are connected by the first via conductor in the first via hole.

In this way, even when the metal plane layer is additionally formed, the number of stacked layers of the stacked via structure is not increased, so that the reliability of electrical connection can be secured.

Also, when forming the metal plane layer, the fine wiring is not formed. Therefore, even when the metal plane layer is additionally formed, there is no fear that the manufacturing yield of the wiring substrate is decreased, and the cost can be reduced.

DETAILED DESCRIPTION

Hereinafter, exemplary embodiments will be described with reference to the accompanying drawings.

Before describing the exemplary embodiment, a preliminary example, which is a basis thereof, is described. A wiring substrate described in the preliminary example is a basis of a wiring substrate of the present invention and is not a well-known technology.

Figure 1:
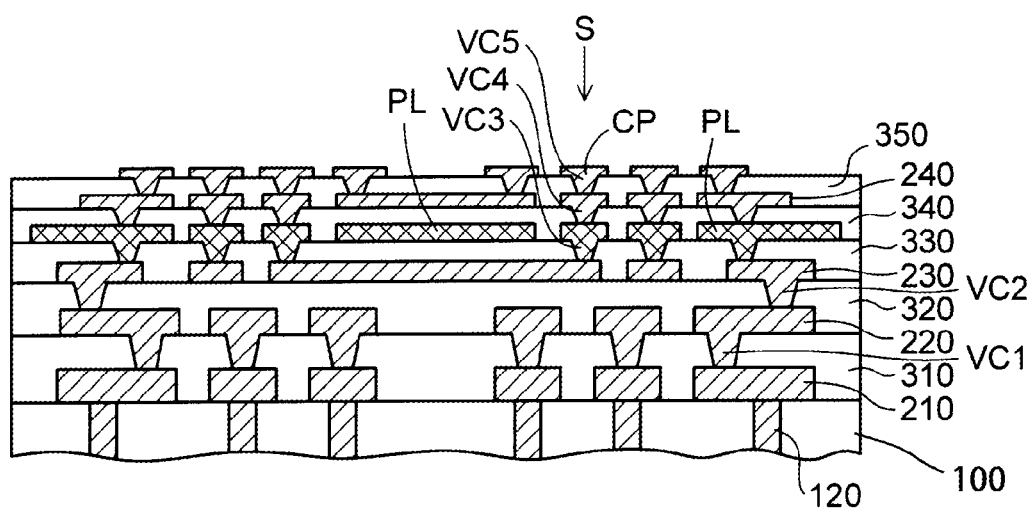
FIG. 1 is a sectional view illustrating a semiconductor device according to a preliminary example.

FIG. 1 is a sectional view illustrating a semiconductor device according to the preliminary example. In FIG. 1, an upper surface-side of a core substrate of a wiring substrate having the core substrate is partially shown.

As shown in FIG. 1, the wiring substrate according to the preliminary example is formed with a first wiring layer 210 on an upper surface of a core substrate 100. The core substrate 100 is formed with through-conductors 120 penetrating the same in a thickness direction. The first wiring layer 210 is connected to a lower surface-side wiring layer (not shown) of the core substrate 100 through the through-conductors 120.

A first insulation layer 310 is formed on the core substrate 100. A second wiring layer 220, which is connected to the first wiring layer 210 via first via conductors VC1, is formed on the first insulation layer 310.

Also, a second insulation layer 320 is formed on the first insulation layer 310. A third wiring layer 230, which is connected to the second wiring layer 220 via second via conductors VC2, is formed on the second insulation layer 320.

Likewise, a third insulation layer 330 is formed on the second insulation layer 320. A metal plane layer PL, which is connected to the third wiring layer 230 via third via conductors VC3, is formed on the third insulation layer 330.

Also, a fourth insulation layer 340 is formed on the third insulation layer 330. A fourth wiring layer 240, which is connected to the metal plane layer PL via fourth via conductors VC4, is formed on the fourth insulation layer 340.

Also, a fifth insulation layer 350 is formed on the fourth insulation layer 340. A connection pad CP, which is connected to the fourth wiring layer 240 via fifth via conductors VC5, is formed on the fifth insulation layer 350.

The third and fourth wiring layers 230, 240 are set to have a wiring pitch narrower than the first and second wiring layers 210, 220 and are thus formed as a fine wiring, respectively. In the fine wirings, portions thereof to which two signal wirings extend in parallel are likely to be influenced by crosstalk, so that a malfunction is likely to occur.

The metal plane layer PL is formed so as to suppress the crosstalk occurring between patterns of the third fine wiring layer 230 arranged below the metal plane layer. Also, the metal plane layer PL is formed so as to suppress the crosstalk occurring between patterns of the fourth fine wiring layer 240 arranged above the metal plane layer. The metal plane layer PL is formed as a ground line or power supply line.

The metal plane layer PL is arranged to be close to the third and fourth fine wiring layers 230, 240, so that a signal becoming a noise is absorbed by the metal plane layer PL and the crosstalk is thus suppressed.

In this way, in order to suppress the crosstalk between the patterns of the fine wiring layer, it is required to insert the metal plane layer PL below or above the wiring layer. The metal plane layer PL is formed by the same method as the other wiring layer forming method. For this reason, since the number of stacked layers of the wiring layers is increased by one layer, the manufacturing yield is decreased and the cost is increased.

Also, a stacked via structure is established in the multi-layered wiring. Therefore, when forming the metal plane layer PL, it is necessary to correspond to the stacked via structure by arranging a via receiving pad (which is a pad for connecting the vias), like the other wiring layers.

In the example of FIG. 1, the third via conductor VC3, the fourth via conductor VC4 and the fifth via conductor VC5 are vertically stacked between the third wiring layer 230 and the connection pad CP at a place denoted with a symbol S, so that a three-stage stacked via structure is established.

For this reason, since the number of stacked layers of the stacked via structure is increased by one due to the insertion of the metal plane layer PL, the reliability of connection is lowered.

In the fine multi-stage stacked via structure, when thermal stress is generated by heating processing, the stress is concentrated on the lowest part of the stacked via structure, so that the via is likely to be fractured and the reliability of electrical connection cannot be thus secured. For this reason, it is preferably to reduce the number of stacked layers of the stacked via structure as much as possible.

As described above, when the metal plane layer PL is formed by the same method as the other wiring layers, the number of stacked layers of the multi-layered wiring having the stacked via structure is increased by one layer, which decreases the manufacturing yield and increases the cost.

A wiring substrate and a manufacturing method thereof according to an exemplary embodiment, which will be described later, can solve the above-described problems.

Exemplary Embodiment

Figure 11:
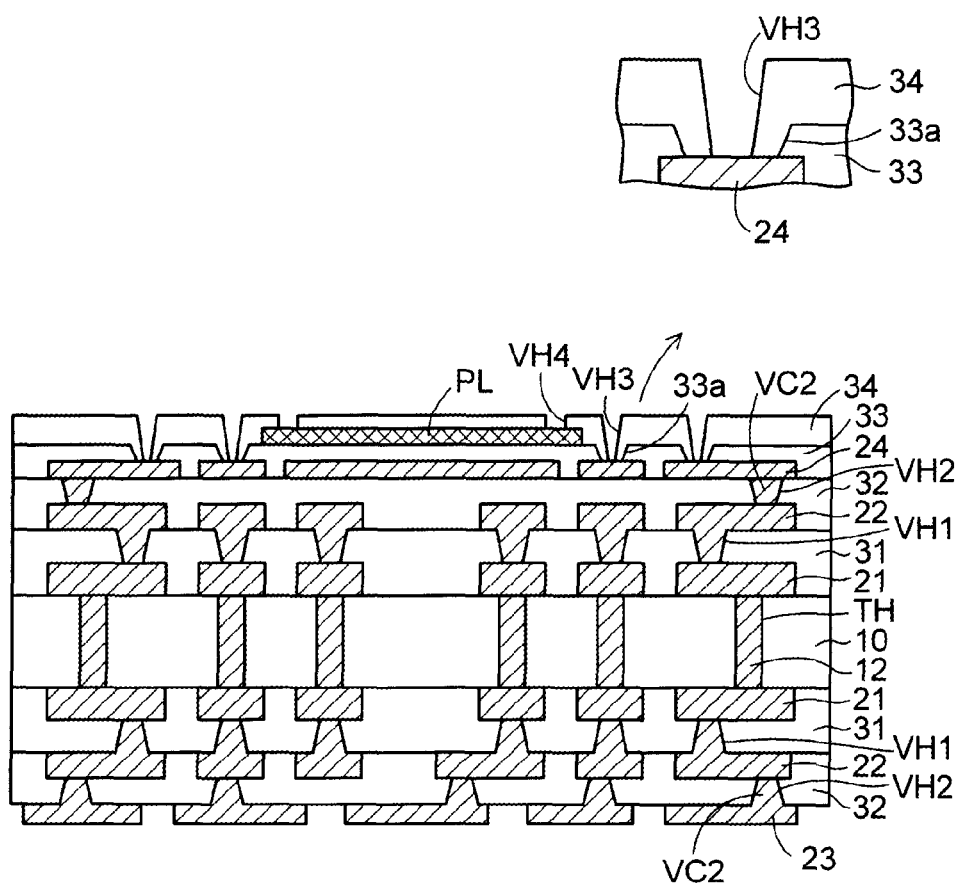
FIG. 11 is a sectional view illustrating the manufacturing method of the wiring substrate according to the exemplary embodiment.
Figure 12:
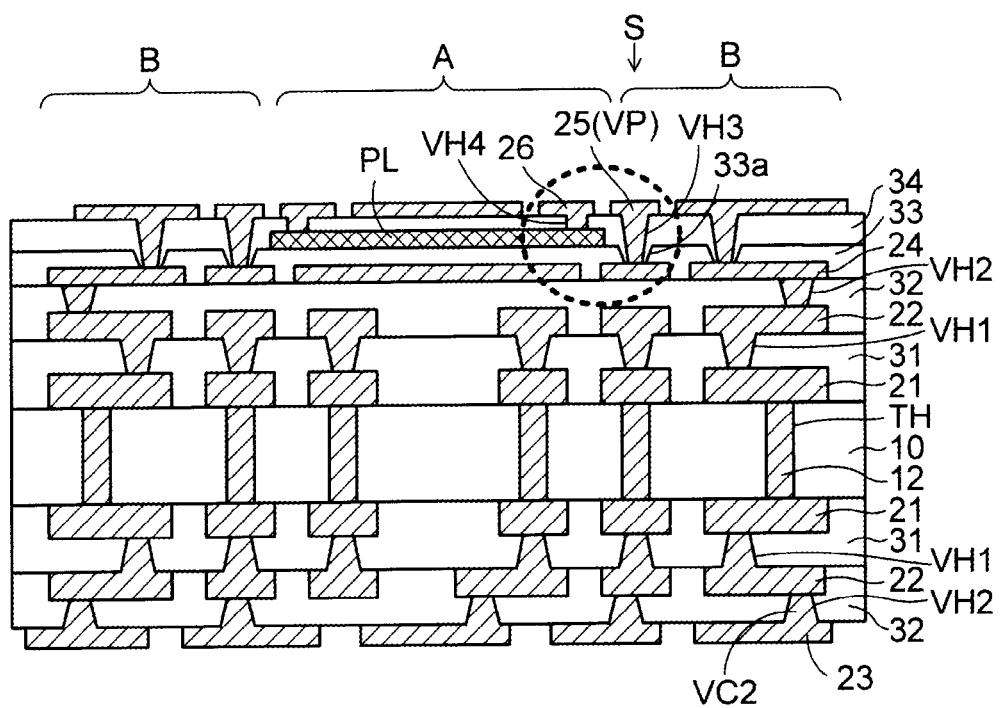
FIG. 12 is a sectional view illustrating the manufacturing method of the wiring substrate according to the exemplary embodiment.
Figure 12:
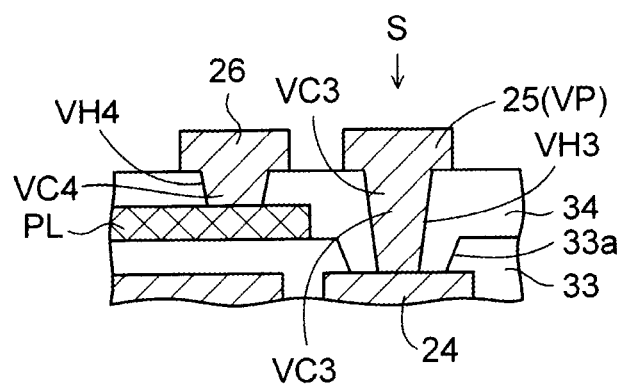
Figure 13:
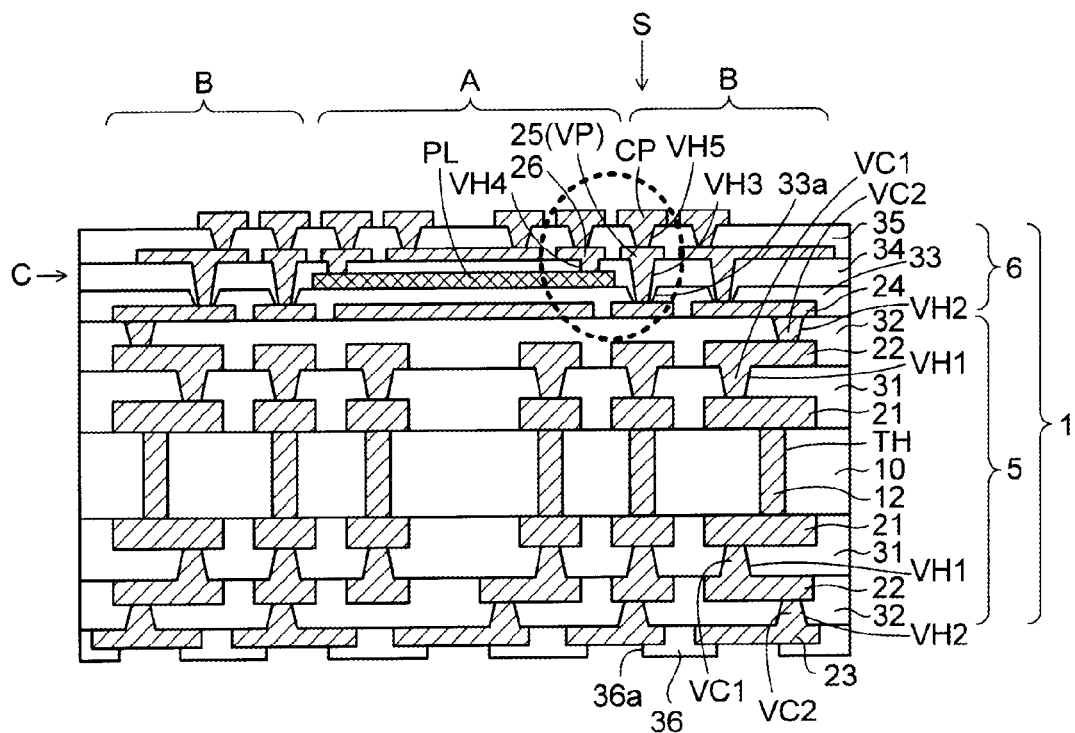
FIG. 13 is a sectional view illustrating a wiring substrate according to the exemplary embodiment.
Figure 13:
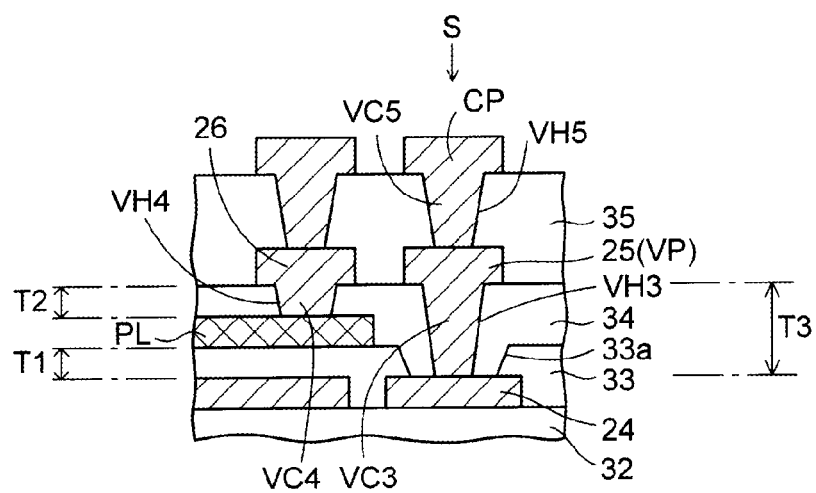

FIGS. 2A to 12 illustrate a method of manufacturing a wiring substrate of an exemplary embodiment, and FIG. 13 illustrates a wiring substrate of the exemplary embodiment. Hereinafter, not only the manufacturing method of the wiring substrate but also a structure of the wiring substrate is described.

Figure 2A:
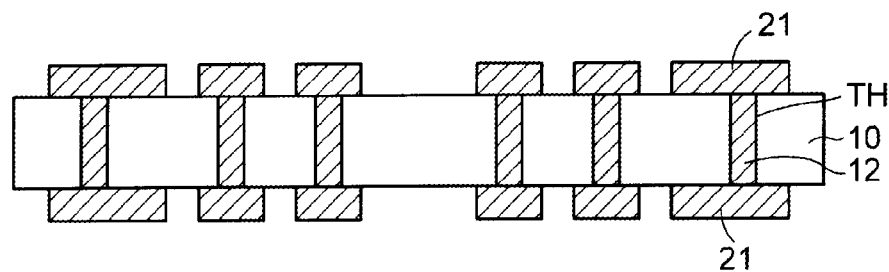
FIGS. 2A to 2C are sectional views illustrating a manufacturing method of a wiring substrate according to an exemplary embodiment.

According to the manufacturing method of the wiring substrate of the exemplary embodiment, a core substrate 10 having a structure as shown in FIG. 2A is first prepared. The core substrate 10 is formed with through-holes TH penetrating the same in a thickness direction. The through-hole TH is formed therein with a through-conductor 12.

For example, the through-hole TH is filled with copper plating, so that the through-conductor 12 is formed. The core substrate 10 is formed of an insulating material such as a glass epoxy resin.

Both surfaces of the core substrate 10 are formed with a first wiring layer 21, respectively. The first wiring layers 21 on both surfaces are connected each other via the through-conductors 12.

In the meantime, the through-conductor 12 may be a through-hole plating layer formed on an inner wall of the through-hole TH of the core substrate 10. In this case, the remaining part of the through-hole TH is filled with a resin material.

The through-hole TH of the core substrate 10 is formed by drill or laser processing. Also, the through-conductors 12 and the first wiring layer 21 formed in and on the core substrate 10 are formed using a plating method, a photolithography and the like.

Figure 2B:
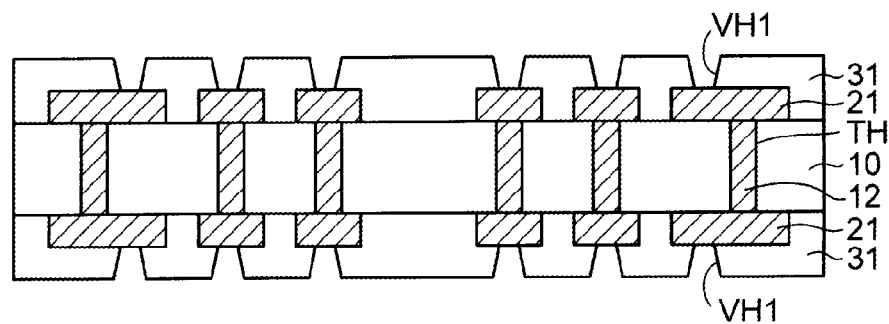

Subsequently, as shown in FIG. 2B, resin films, which are not cured yet, are attached to both surfaces of the core substrate 10 and heated and cured, so that a first insulation layer 31 is respectively formed thereon. Thereafter, the first insulation layers 31 on both surfaces are processed by the laser, so that first via holes VH1 reaching the first wiring layers 21 on both surfaces are respectively formed.

In the above method, the first via hole VH1 is formed by the laser. Therefore, the first insulation layer 31 is formed of a non-photosensitive resin. As the resin material, an epoxy resin, a polyimide resin and the like are used. For example, a thickness of the first insulation layer 31 is about 30 μm to 35 μm, and a diameter of the first via hole VH1 is about 30 μm to 50 μm.

Further, an inside of the first via hole VH1 is desmear-processed by a permanganic acid method and the like, so that a resin smear is removed.

Figure 2C:
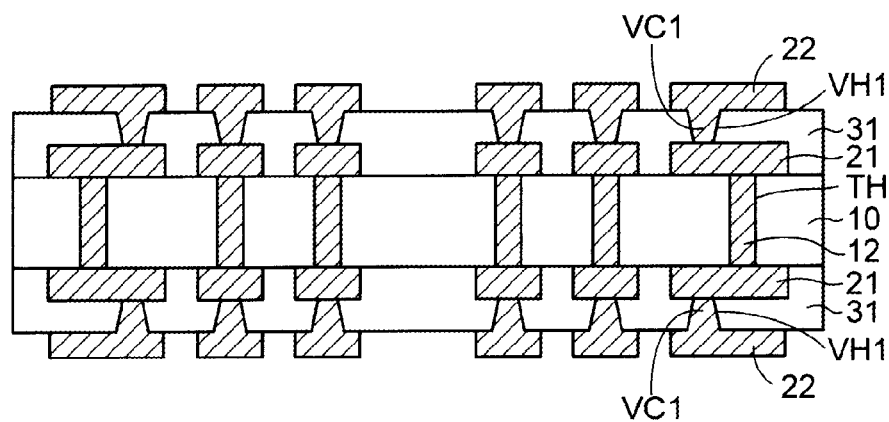

Subsequently, as shown in FIG. 2C, a second wiring layer 22, which is connected to the first wiring layer 21 via first via conductors VC1 in the first via holes VH1, is respectively formed on the first insulation layers 31 on both surfaces. The second wiring layer 22 is formed by a semi-additive method. This is described in detail with reference to FIGS. 3A to 3E. FIGS. 3A to 3E partially illustrate an upper region from a top of the core substrate 10 of FIG. 2B.

Figure 3A:
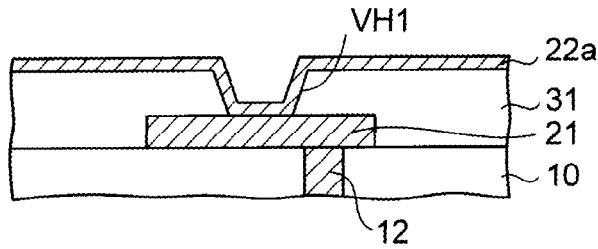
FIGS. 3A to 3E are sectional views illustrating the manufacturing method of the wiring substrate according to the exemplary embodiment.

As shown in FIG. 3A, a seed layer 22a consisting of copper and having a thickness of about 1 μm is formed on the first insulation layer 31 and on an inner surface of the first via hole VH1 by an electroless plating.

Figure 3B:
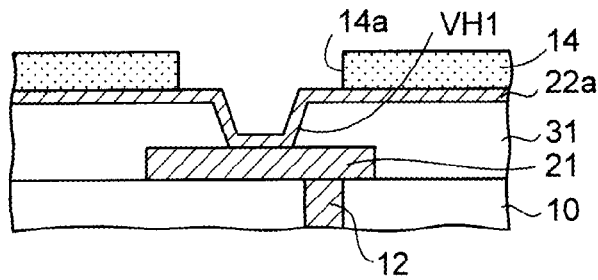

Then, as shown in FIG. 3B, a plating resist layer 14 having an opening 14a formed at a part at which the second wiring layer 22 is to be arranged is formed.

Figure 3C:
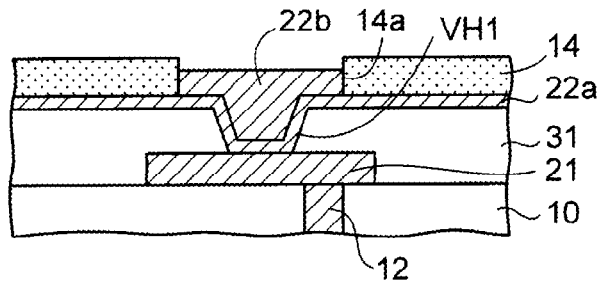
Figure 3D:
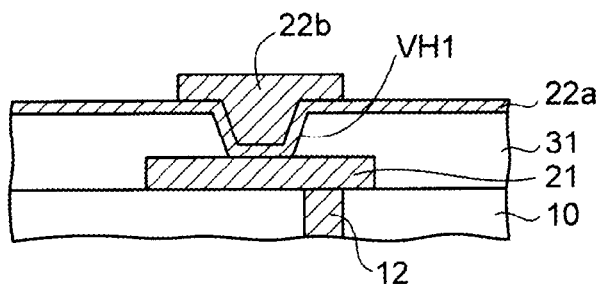

Continuously, as shown in FIG. 3C, a metal plated layer 22b consisting of copper and the like is formed in the opening 14a of the plating resist layer 14 by an electrolytic plating in which the seed layer 22a is used as a plating power feeding path. Thereafter, as shown in FIG. 3D, the plating resist layer 14 is removed.

Figure 3E:
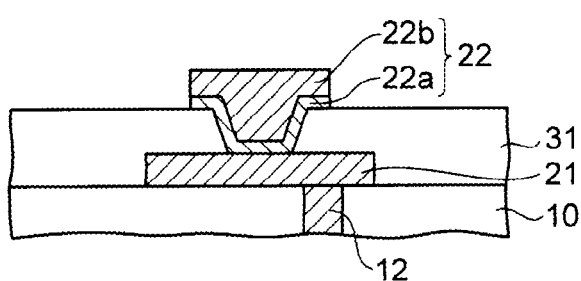

Further, as shown in FIG. 3E, the seed layer 22a is removed by a wet etching in which the metal plated layer 22b is used as a mask. Thereby, the second wiring layer 22 is formed from the seed layer 22a and the metal plated layer 22b.

Figure 4:
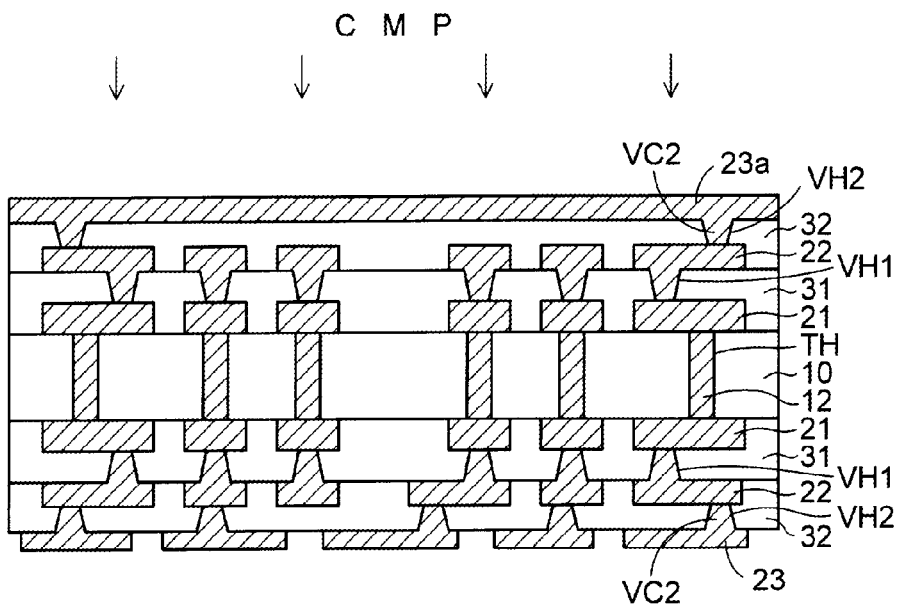
FIG. 4 is a sectional view illustrating the manufacturing method of the wiring substrate according to the exemplary embodiment.

Subsequently, as shown in FIG. 4, like the process shown in FIG. 2B, a second insulation layer 32 having second via holes VH2 reaching the second wiring layer 22 is respectively formed on both surfaces of the structure shown in FIG. 2C.

Further, as shown in FIG. 4, a third wiring layer 23, which is connected to the second wiring layer 22 via the second via conductors VC2 in the second via holes VH2, is formed on the second insulation layer 32 of the lower surface-side by the same method as the process shown in FIG. 2C.

At the same time, a metal layer 23a, which is connected to the second wiring layer 22 via the second via conductors VC2 in the second via holes VH2, is formed in a blanket form on an entire surface of the second insulation layer 32 of the upper surface-side.

Figure 5:
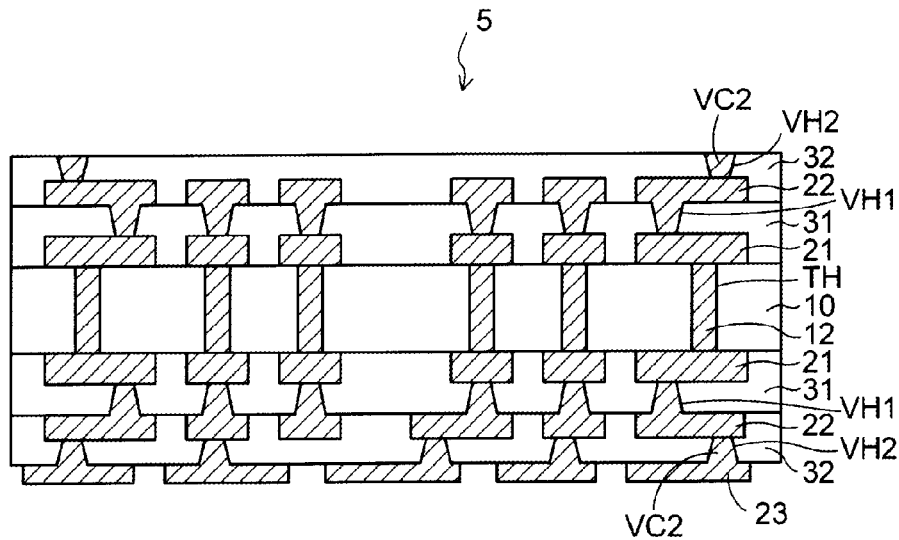
FIG. 5 is a sectional view illustrating the manufacturing method of the wiring substrate according to the exemplary embodiment.

Continuously, as shown in FIGS. 4 and 5, the metal layer 23a of the upper surface-side is polished by CMP (Chemical Mechanical Polishing) until the second insulation layer 32 is exposed. The surface of the second insulation layer 32 is further polished and flattened.

Thereby, as shown in FIG. 5, a global unevenness of the second insulation layer 32, which is generated due to the unevenness of the first and second wiring layers 21, 22, is removed, so that the upper surface of the second insulation layer 32 is formed as a flat surface.

The second via conductors VC2 formed in the second insulation layer 32 of FIG. 4 remain as a via electrode. Thereby, upper surfaces of the second via conductors VC2 and the upper surface of the second insulation layer 32 are flush with each other and are flattened.

In this way, the metal layer 23a formed on the upper surface-side of the core substrate 10 is formed for flattening a surface on which a multi-layered wiring layer having a narrower wiring pitch is to be formed and is removed by the polishing.

By the above processes, a first multi-layered wiring layer 5, which is a base substrate of the wiring substrate of the exemplary embodiment, is obtained. As described in FIGS. 3A to 3E, the second wiring layer 22 of the first multi-layered wiring layer 5 is formed by the semi additive method in which the seed layer 22a is removed by the wet etching.

For this reason, in the processes of FIGS. 3D and 3E, since an undercut is caused due to the thinning of the metal plated layer 22b and the side etching of the seed layer 22a, it is difficult to form a wiring layer having a narrow pitch.

For this reason, a line (width) to a space (interval) of the second wiring layer 22 of the first multi-layered wiring layer 5 is set to 20 μm: 20 μm or greater, for example. Also, a thickness of the second wiring layer 22 is set to 10 μm to 30 μm, for example. The first wiring layer 21 of the first multi-layered wiring layer 5 is also formed by the same wiring specification.

Subsequently, a method of forming a second multi-layered wiring layer having a wiring pitch narrower than the first and second wiring layers 21, 22 on the first multi-layered wiring layer 5 is described. The wiring pitch of the first multi-layered wiring layer 5 corresponds to a mounting substrate such as a motherboard. The pitch is converted so that the wiring pitch is narrowed by the second multi-layered wiring layer. Thereby, it is possible to correspond to connection of a semiconductor device.

Figure 6:
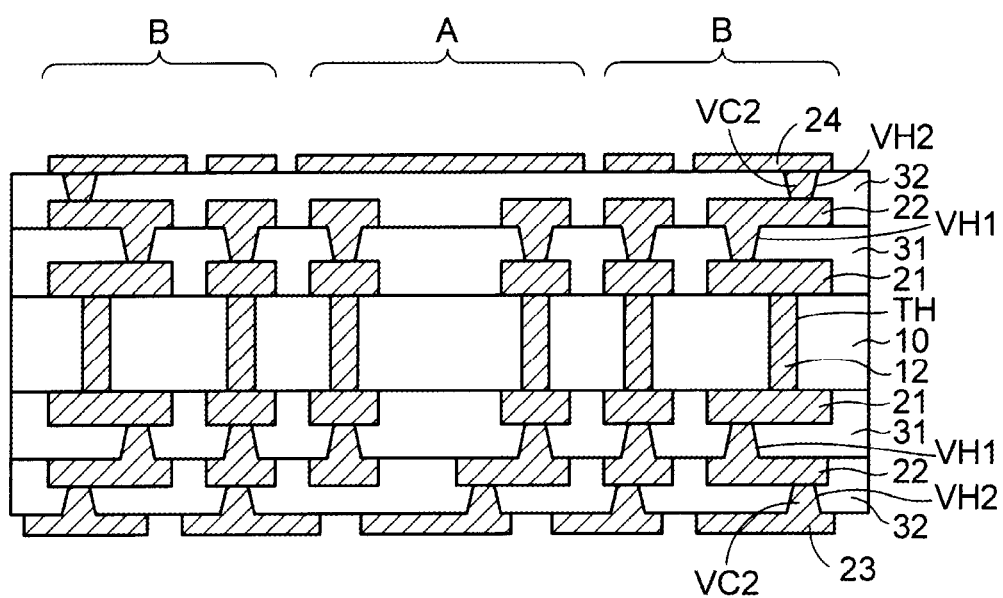
FIG. 6 is a sectional view illustrating the manufacturing method of the wiring substrate according to the exemplary embodiment.

As shown in FIG. 6, a fourth wiring layer 24, which is connected to the second via conductors VC2, is formed on the second insulation layer 32 of the first multi-layered wiring layer 5. The fourth wiring layer 24 is formed by a semi additive method in which a seed layer is removed by an anisotropic dry etching. This is described in detail with reference to FIGS. 7A to 7E. FIGS. 7A to 7E partially illustrate an upper region from a top of the second insulation layer 32 of the upper surface-side of FIG. 5.

Figure 7A:
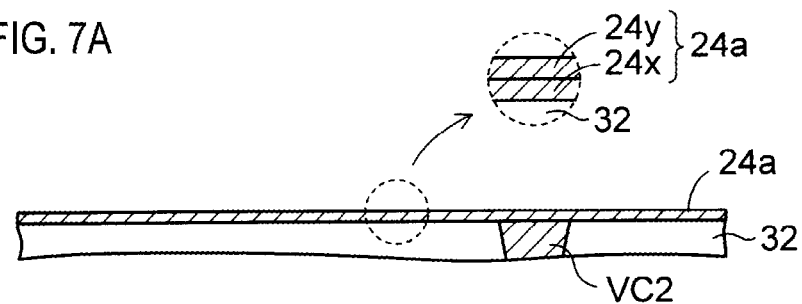
FIGS. 7A to 7E are sectional views illustrating the manufacturing method of the wiring substrate according to the exemplary embodiment.

As shown in FIG. 7A, a seed layer 24a is first formed on the second insulation layer 32 and the second via conductors VC2 of FIG. 5. As an example of the seed layer 24a, a titanium (Ti) layer 24x having a thickness of 20 nm to 50 nm is formed by a sputtering method and a copper (Cu) layer 24y having a thickness of 0.5 μm is then formed on the titanium layer 24x by the electroless plating.

Alternatively, a copper layer having a thickness of 100 nm to 300 nm may be formed on the titanium layer 24x by the sputtering method and the copper layer 24y may be formed thereafter by the electroless plating.

Figure 7B:
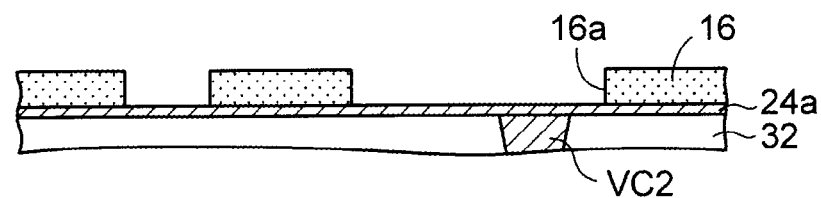

Then, as shown in FIG. 7B, a plating resist layer 16 having an opening 16a formed at a part at which the fourth wiring layer 24 is to be arranged is formed on the seed layer 24a by a photolithography. Since the fourth wiring layer 24 is formed as a fine wiring, a stepper (a step-type reduction projection exposure apparatus) is used as an exposure apparatus.

As described above, since the upper surface of the second insulation layer 32 is flattened, it is possible to pattern the fine plating resist layer 16 with precision in the substrate, even though a depth of focus of the photolithography is lowered when forming a fine pattern.

Figure 7C:
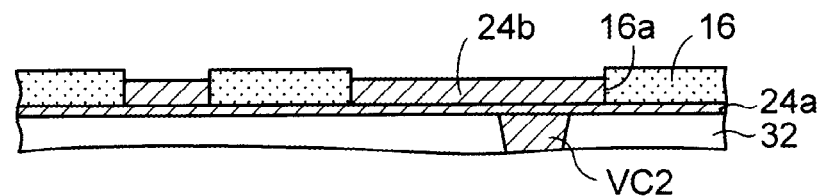
Figure 7D:
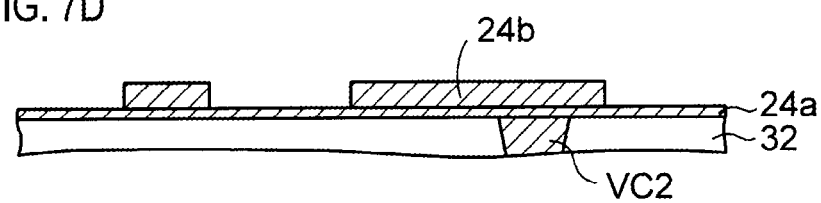

Continuously, as shown in FIG. 7C, a metal plated layer 24b consisting of copper and the like is formed in the opening 16a of the plating resist layer 16 by the electrolytic plating in which the seed layer 24a is used as a plating power feeding path. Thereafter, as shown in FIG. 7D, the plating resist layer 16 is removed.

Figure 7E:
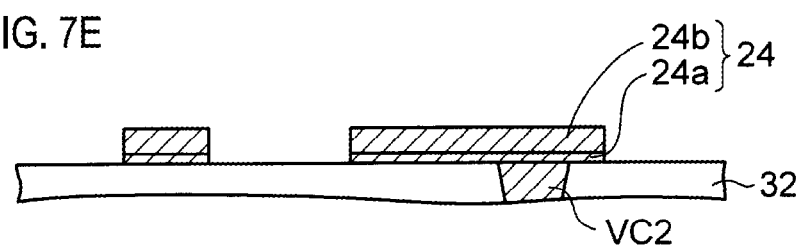

Further, as shown in FIG. 7E, the seed layer 24a is removed by the anisotropic dry etching in which the metal plated layer 24b is used as a mask.

The anisotropic dry etching is performed by a dry etching apparatus such as a reactive ion etching (RIE) apparatus, an inductively coupled plasma (ICP) apparatus and the like.

The anisotropic dry etching is adopted, so that it is possible to infinitesimally suppress the thinning of the metal plated layer 24b and the seed layer 24a is not side-etched inwards from a lower end of the metal plated layer 24b. As a result, a width of the seed layer 24a is formed to be the same as or to be wider than a width of the metal plated layer 24b.

Also, since the upper surface of the second insulation layer 32 is flattened, the residues are difficult to occur when etching the seed layer 24a. Therefore, it is possible to improve the yield of the wiring formation in the substrate.

In the meantime, when a sheet-type spin etching apparatus and the like is used, it is possible to remove the seed layer 24a with precision to some extent, even though the wet etching is performed.

By the above processes, the fourth wiring layer 24 is formed by the seed layer 24a and the metal plated layer 24b.

Returning to FIG. 6, the fourth wiring layer 24 is formed to have a fine wiring part A, which is formed as a fine wiring having a narrow wiring interval, and non-fine wiring parts B having a wiring interval wider than the fine wiring part A. The non-fine wiring parts B are arranged at both outer regions of the fine wiring part A.

In the fine wiring part A of the fourth wiring layer 24, a line (width) to a space (interval) H is 2 μm: 2 μm, for example, and it is possible to form the fine wiring part A with high yield in the design specification by the semi additive method. Also, a thickness of the fourth wiring layer 24 is set as a thin film of 2 μm to 3 μm.

In contrast, in the non-fine wiring part B of the fourth wiring layer 24, a line (width) to a space (interval) is 20 μm: 20 μm or greater, for example, and the design rule thereof is set more loosely that the fine wiring part A.

In this way, it is possible to set the wiring pitch of the fine wiring part A of the fourth wiring layer 24 to be narrower than the wiring pitches of the first and second wiring layers 21, 22 of the first multi-layered wiring layer 5.

By the above method, a wiring member including the fourth wiring layer 24, which has the fine wiring part A having the narrow wiring interval and the non-fine wiring parts B having the wiring interval wider than the fine wiring part A, is prepared. The fourth wiring layer 24 having the fine wiring part A is formed on the first multi-layered wiring layer 5 of which the design rule is loose.

Figure 8:
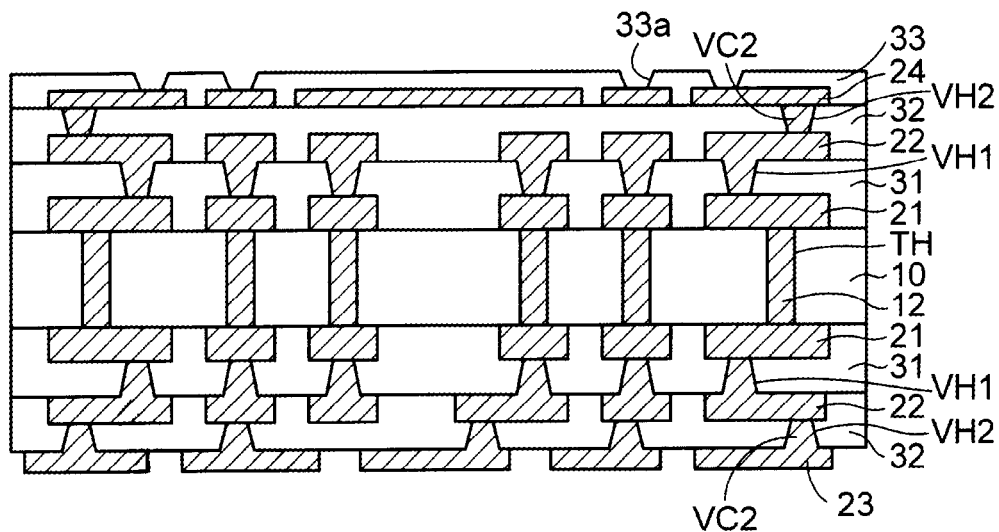
FIG. 8 is a sectional view illustrating the manufacturing method of the wiring substrate according to the exemplary embodiment.

Subsequently, as shown in FIG. 8, a photosensitive resin (not shown) is formed on the second insulation layer 32 and fourth wiring layer 24 of the structure shown in FIG. 6, is exposed/developed by the photolithography and is heated and cured. As the photosensitive resin, a liquid phase resin may be applied or a resin thin film may be bonded.

Thereby, a third insulation layer 33 having openings 33a arranged on the connection part of the fourth wiring layer 24 is formed on the second insulation layer 32.

By patterning the photosensitive resin, which does not contain an inorganic filler such as silica, by the photolithography, it is possible to form the third insulation layer 33 of a thin film having the fine openings 33a.

As an example of the third insulation layer 33, a permanent resist layer formed of a phenol-based resin having photosensitivity is used. The same resin material and the same formation method are also used when forming following other insulation layers.

A thickness of the third insulation layer 33 is set as a thin film having 2 μm to 3 μm on the fourth wiring layer 24. Also, a diameter of the opening 33a formed in the third insulation layer 33 is about 20 μm, for example.

As described below, a metal plane layer is formed on the third insulation layer 33 so as to suppress the crosstalk between patterns of the fine wiring part A of the fourth wiring layer 24. The effect of suppressing the crosstalk is increased when the fourth wiring layer 24 and the metal plane layer are formed to be closer to each other. Therefore, the thickness of the third insulation layer 33 is set as a thin film.

In this way, when the photosensitive resin is patterned by the photolithography, it is possible to make the insulation layer thinner and the opening or via hole narrower, as compared to the method of processing the resin layer by the laser.

Figure 9:
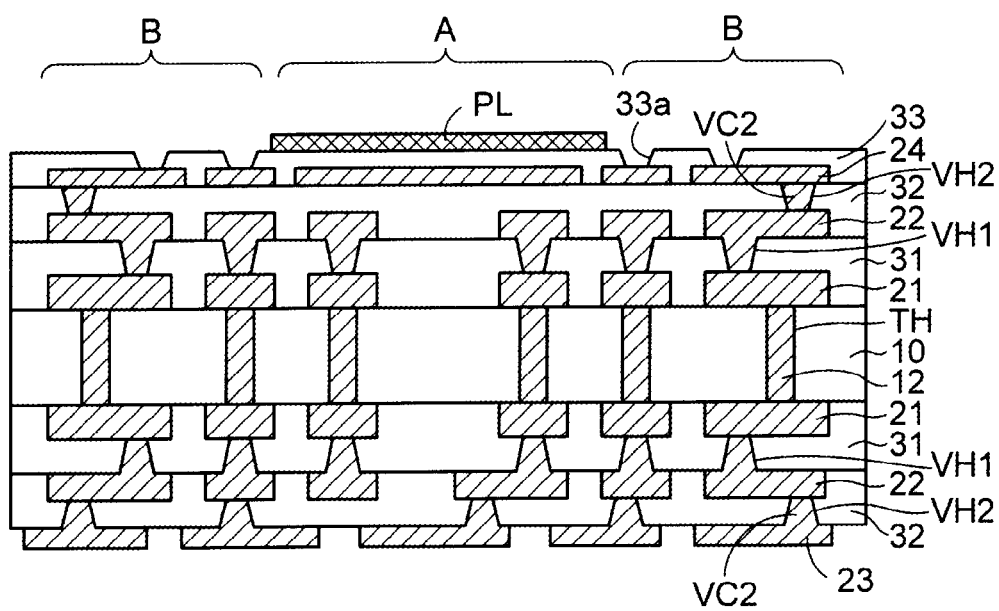
FIG. 9 is a sectional view illustrating the manufacturing method of the wiring substrate according to the exemplary embodiment.
Figure 10A:
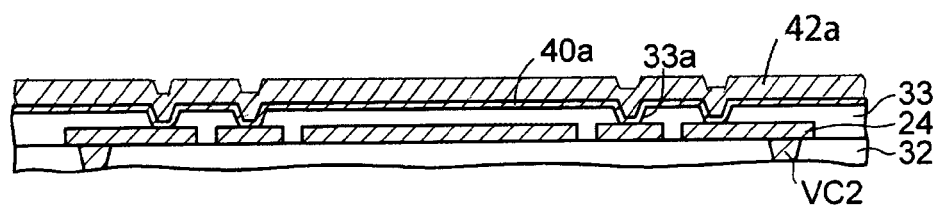
FIGS. 10A to 10C are sectional views illustrating the manufacturing method of the wiring substrate according to the exemplary embodiment.
Figure 10B:
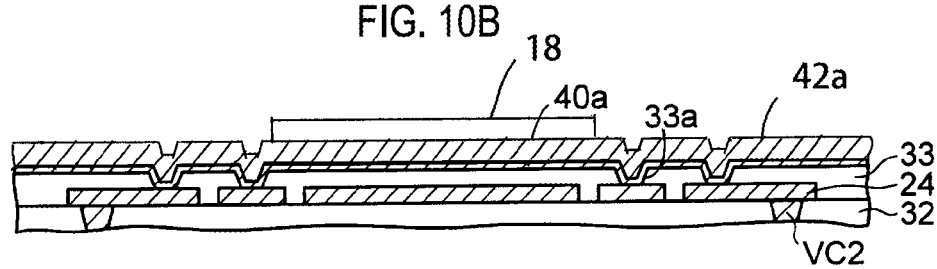
Figure 10C:
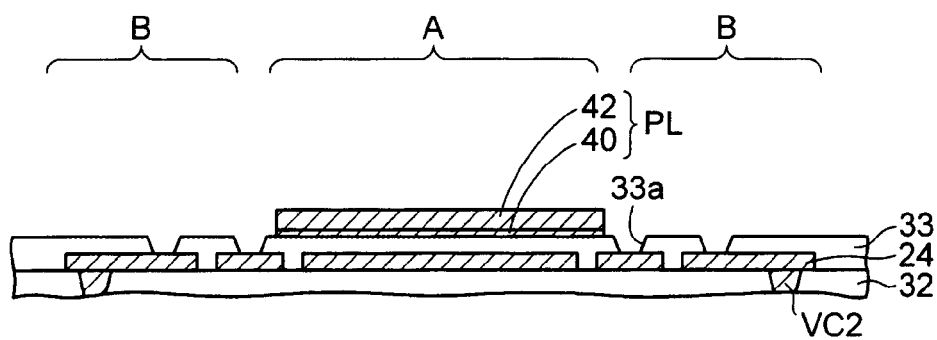

Subsequently, as shown in FIG. 9, a metal plane layer PL is formed on the third insulation layer 33. The metal plane layer PL is formed by a subtractive method. This is described in detail with reference to FIGS. 10A to 10C. FIGS. 10A to 10C partially illustrate an upper region from a top of the second insulation layer 32 shown in FIG. 8.

As shown in FIG. 10A, a metal layer 40a is formed on the third insulation layer 33 and on an inner surface of the opening 33a of the upper surface-side of the structure of FIG. 8. As an example of the metal layer 40a, a titanium (Ti) layer having a thickness of 20 to 50 nm is formed by the sputtering method.

Continuously, a metal plated layer 42a made of copper and the like and having a thickness of about 1 μm is formed on the metal layer 40a by the electroless plating.

Subsequently, as shown in FIG. 10B, a resist layer 18 is patterned on the metal plated layer 42a by the photolithography. The resist layer 18 is remained in a region in which the metal plane layer PL is arranged. The metal plane layer PL does not have a fine wiring and is simply formed into a batch pattern such as a rectangular shape (in other words, the metal plane layer P1 is simply formed into a predetermined pattern with one-shot exposure). For this reason, as the exposure apparatus, a simple contact exposure apparatus configured to be closely contacted to a substrate and to expose an entire surface thereof is used.

Further, as shown in FIG. 10C, the metal layer 40a and the metal plated layer 42a exposed from the resist layer 18 are removed by the dry etching in which the resist layer 18 is used as a mask. As the dry etching, an isotropic dry etching is preferably adopted so that the residues are not generated on a sidewall of the opening 33a of the third insulation layer 33. Alternatively, the wet etching may be adopted.

After that, the resist layer 18 is removed. Thereby, a metal layer 40 and a metal plated layer 42 are patterned and formed in a region in which the metal plane layer PL is arranged.

Thereby, the metal plane layer PL consisting of the metal layer 40 and the metal plated layer 42 is formed on the third insulation layer 33 in the region corresponding to the fine wiring part A of the fourth wiring layer 24. The metal plane layer PL may be formed as a ground plane layer or power supply plane layer.

The metal plane layer PL is formed into a batch pattern in the region corresponding to the fine wiring part A of the fourth wiring layer 24 and is not arranged in a region corresponding to the non-fine wiring part B of the fourth wiring layer 24.

The metal plane layer PL is formed so as to suppress the crosstalk occurring between the patterns of the fine wiring layer. The non-fine wiring part B of the fourth wiring layer 24 is loose in terms of the design rule and the crosstalk is not problematic. Therefore, it is not necessary to arrange the metal plane layer PL in the region of the non-fine wiring part B.

It is not necessarily required to arrange the metal plane layer PL in correspondence to the entire region of the fine wiring part A of the fourth wiring layer 24. Even when a peripheral edge of the fine wiring part A slightly protrudes from the metal plane layer PL, the crosstalk is sufficiently suppressed.

Thereby, as shown in FIGS. 9 and 10C, in the process of forming the metal plane layer PL, the forming process of the via receiving pad for establishing the stacked via structure is omitted. Also, the metal plane layer PL is formed on the third insulation layer 33 with the openings 33a of the third insulation layer 33 being exposed.

As described above, in order to increase the effect of suppressing the crosstalk of the fourth wiring layer 24, the third insulation layer 33 is formed as a thin film having a thickness of about 2 μm. For this reason, the unevenness of the fourth wiring layer 24 formed below the third insulation layer 33 cannot be sufficiently flattened, so that the third insulation layer 33 is formed with an unevenness somewhat remaining.

However, the metal plane layer PL is simply formed into the batch pattern in the region corresponding to the fine wiring part A of the fourth wiring layer 24 and it is not necessary to form a fine wiring. Therefore, even when the unevenness is somewhat formed on the upper surface of the third insulation layer 33, it does not cause a problem when forming the metal plane layer PL.

Subsequently, as shown in FIG. 11, a fourth insulation layer 34 is patterned and formed on the third insulation layer 33 and metal plane layer PL shown in FIG. 3 by the same method as the processes shown in FIG. 8.

The fourth insulation layer 34 is patterned so that a third via hole VH3 is arranged in the opening 33a of the third insulation layer 33 and a fourth via hole VH4 is arranged on the metal plane layer PL.

Additionally referring to a partial enlarged sectional view of FIG. 11, a diameter of the third via hole VH3 of the fourth insulation layer 34 is set to be smaller than a diameter of the opening 33a of the third insulation layer 33. The third via hole VH3 is formed in the fourth insulation layer 34 configured to fill the openings 33a of the third insulation layer 33. The third via hole VH3 is arranged at an inner side of the opening 33a of the third insulation layer 33.

The fourth insulation layer 34 is also formed as a thin film having a thickness of about 2 μm so as to improve the effect of suppressing the crosstalk occurring in a fifth wiring layer to be formed at an upper side.

The metal plane layer PL is formed into the batch pattern. Therefore, even when the surface on which the metal plane layer PL is formed is somewhat formed with the unevenness, the surface of the metal plane layer PL has a better flatness, as compared to a configuration where a fine wiring layer is formed.

For this reason, even when the fourth insulation layer 34 is formed as a thin film on the metal plane layer PL, it is possible to secure the flatness of the upper surface of the fourth insulation layer 34. Also, since the thickness of the metal plane layer PL is thin, such as 1 μm, it is possible to easily flatten the unevenness thereof.

In the meantime, in addition to the example shown in the partial enlarged sectional view of FIG. 11, a diameter of the third via hole VH3 of the fourth insulation layer 34 may be set to be the same as the diameter of the opening 33a of the third insulation layer 33. Alternatively, contrary to the partial enlarged sectional view of FIG. 11, the diameter of the third via hole VH3 of the fourth insulation layer 34 may be set to be greater than the diameter of the opening 33a of the third insulation layer 33, and the third via hole VH3 may be arranged outside the opening 33a.

In this case, the third via hole VH3 and each sidewall of the opening 33a are configured to communicate with each other, so that a via hole is formed on the fourth wiring layer 24.

In this way, the via hole extending from the upper surface of the fourth insulation layer 34 to the fourth wiring layer 24 is formed.

In FIGS. 12 and 13, a region surrounded by the dotted line is shown as a partial enlarged sectional view. As shown in FIG. 12 and other partial enlarged sectional views, a fifth wiring layer 25, which is connected to the fourth wiring layer 24 via third via conductors VC3 in the third via holes VH3, is formed on the fourth insulation layer 34 by the same method as the processes shown in FIGS. 7A to 7E.

At the same time, a sixth wiring layer 26, which is connected to the metal plane layer PL via fourth via conductors VC4 in fourth via holes VH4, is formed on the fourth insulation layer 34. The fifth wiring layer 25 and the sixth wiring layer 26 are formed from the same layer by the same process.

The design rules of the fifth and sixth wiring layers 25, 26, such as the wiring pitch, are set in the same manner as the fourth wiring layer 24 described with reference to FIGS. 6 and 7A to 7E. The fifth and sixth wiring layers 25, 26 are also formed to have a fine wiring part A and non-fine wiring parts B arranged at both outer sides thereof.

Since the upper surface of the fourth insulation layer 34 is flat, it is possible to form the fifth and sixth wiring layers 25, 26 on the fourth insulation layer 34 with high yield.

Also, a via receiving pad VP for establishing the stacked via structure is formed at a place denoted with a symbol S in the formation processes of the fifth and sixth wiring layers 25, 26. The third via conductor VC3 in the third via hole VH3 is arranged below the via receiving pad VP (refer to the partial enlarged sectional view).

In the wiring substrate finally obtained in the exemplary embodiment, the uppermost layer is provided with a plurality of semiconductor device mounting parts, and the fourth wiring layer 24 or fifth wiring layer 25 is formed to have a wiring layer for connecting the plurality of semiconductor devices each other.

Thereafter, as shown in FIG. 13 and the partial enlarged sectional view thereof, a fifth insulation layer 35 of which fifth via holes VH5 are arranged on the fifth wiring layer 25 is formed by the same method as the processes shown in FIG. 8.

Further, a connection pad CP, which is connected to the fifth and sixth wiring layers 25, 26 via fifth via conductors VC5 in the fifth via holes VH5, is formed on the fifth insulation layer 35 by the same method as the processes shown in FIGS. 7A to 7E (refer to the partial enlarged sectional view).

The connection pad CP is formed as a seventh wiring layer, and may be a pad arranged in an island shape or a pad connected to an end portion of a lead-out wiring.

Thereby, a second multi-layered wiring layer 6 is formed on the first multi-layered wiring layer 5. The second multi-layered wiring layer 6 includes the fourth wiring layer 24, the metal plane layer PL, the fifth wiring layer 25, the sixth wiring layer 26 and the connection pad CP.

Also, a solder resist layer 36 having openings 36a provided on the connection part of the third wiring layer 23 is formed on the second insulation layer 32 of the lower surface-side of the core substrate 10. By the above processes, a wiring substrate 1 of the exemplary embodiment is obtained.

As shown in FIG. 13, the wiring substrate 1 of the exemplary embodiment has the first multi-layered wiring layer 5 and the second multi-layered wiring layer 6 arranged on the first multi-layered wiring layer 5 and having a wiring pitch narrower than the first multi-layered wiring layer 5.

In the first multi-layered wiring layer 5, the first wiring layer 21 is respectively formed on both surfaces of the core substrate 10. The first wiring layers 21 on both surfaces are connected each other via the through-conductors 12 formed in the core substrate 10.

Both surfaces of the core substrate are formed with the first insulation layers 31 having the first via holes VH1 reaching the first wiring layers 21, respectively. The second wiring layers 22, which are connected to the first wiring layers 21 via the first via conductors VC1 in the first via holes VH1, are formed on the first insulation layers 31 of both surfaces.

Also, the second insulation layer 32 having the second via holes VH2 reaching the second wiring layer 22 is formed on the first insulation layer 31 of the lower surface-side of the core substrate 10. The third wiring layer 23, which is connected to the second wiring layer 22 via the second via conductors VC2 in the second via holes VH2, is formed on the second insulation layer 32 of the lower surface-side of the core substrate 10.

Further, the solder resist layer 36 of which the openings 36a are provided on the connection part of the third wiring layer 23 is formed on the second insulation layer 32 of the lower surface-side of the core substrate 10.

Also, the second insulation layer 32 having the second via conductors VC2 arranged therein and connected to the second wiring layer 22 is formed on the first insulation layer 31 of the upper surface-side of the core substrate 10. By the above, the first multi-layered wiring layer 5 is established.

Subsequently, the second multi-layered wiring layer 6 is described. The fourth wiring layer 24 connected to the second via conductors VC2 is formed on the second insulation layer 32 of the first multi-layered wiring layer 5.

Referring to the partial enlarged sectional views, the third insulation layer 33 of which the openings 33a are arranged on the fourth wiring layer 24 is formed on the second insulation layer 32. The metal plane layer PL is formed on the third insulation layer 33.

Figure 14:
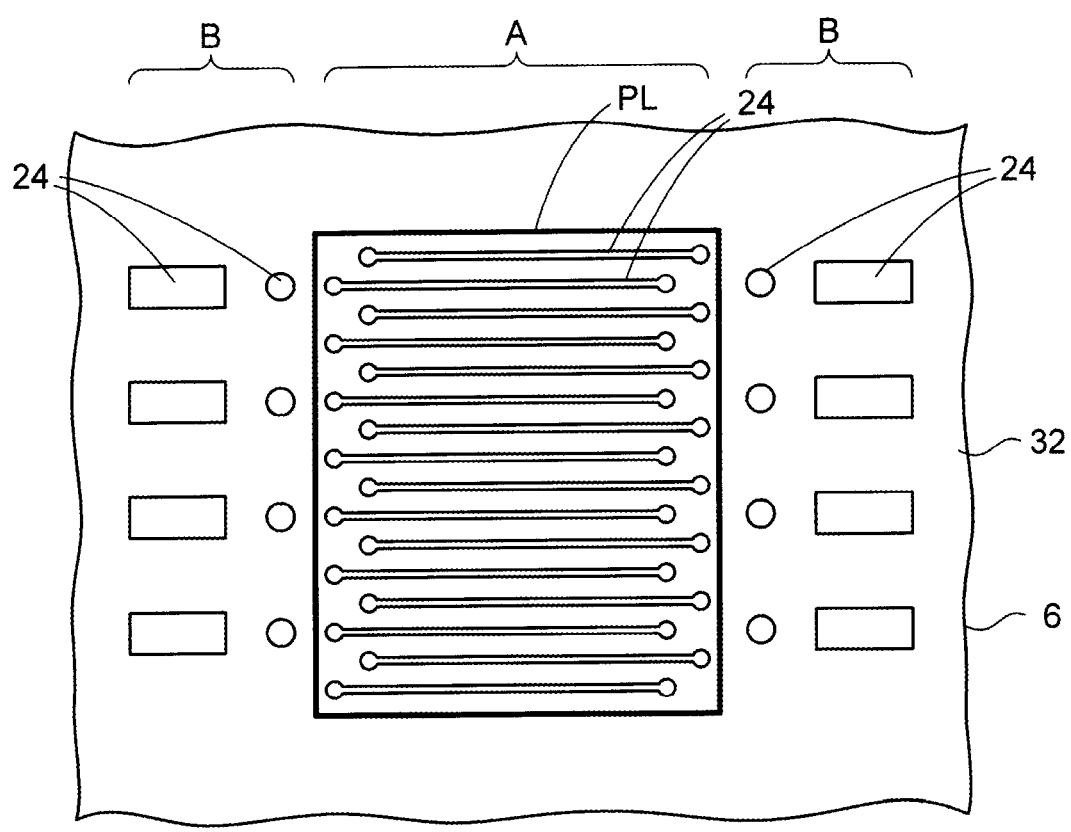
FIG. 14 is a pictorial plan view illustrating a metal plane layer of FIG. 13 and a fourth wiring layer formed below the metal plane layer, as projected from above.

FIG. 14 is a pictorial plan view obtained by cutting a part denoted with a symbol C and having the metal plane layer PL formed therein, which illustrates the metal plane layer PL and the fourth wiring layer 24, as projected from above. In FIG. 14, the elements except for the metal plane layer PL and the fourth wiring layer 24 are omitted.

As shown in FIG. 14, the fourth wiring layer 24 below the metal plane layer PL has the fine wiring part A arranged at a central part and the non-fine wiring parts B arranged at both outer regions of the fine wiring part A. The metal plane layer PL is arranged in the region corresponding to the fine wiring part A except for the non-fine wiring parts B of the fourth wiring layer 24, and is not arranged in the regions corresponding to the non-fine wiring parts B.

It is possible to suppress the crosstalk occurring at the fine wiring part A of the fourth wiring layer 24 by the metal plane layer PL. Since the crosstalk is not problematic in the non-fine wiring parts B of the fourth wiring layer 24, it is not necessary to arrange the metal plane layer PL at the non-fine wiring parts B.

Returning to the partial enlarged sectional view of FIG. 13, the fourth insulation layer 34 is formed on the metal plane layer PL and the third insulation layer 33. In a region except for the metal plane layer PL, the third via holes VH3 extending from the upper surface of the fourth insulation layer 34 to the fourth wiring layer 24 are arranged.

The third insulation layer 33 is formed with the openings 33a, and the fourth insulation layer 34 filling the openings 33a is formed with the third via holes VH3. The third via hole VH3 is arranged at an inner side of the opening 33a of the third insulation layer 33. The sidewalls of the openings 33a of the third insulation layer 33 are covered with the fourth insulation layer 34.

Also, the fourth insulation layer 34 is formed with the fourth via holes VH4 reaching the metal plane layer PL.

The fifth wiring layer 25, which is connected to the fourth wiring layer 24 via the third via conductors VC3 in the third via holes VH3, is formed on the fourth insulation layer 34. Also, the sixth wiring layer 26, which is connected to the metal plane layer PL via the fourth via conductors VC4 in the fourth via holes VH4, is formed on the fourth insulation layer 34.

The fifth and sixth wiring layers 25, 26 are formed from the same layer, and have the fine wiring part A at the central part and the non-fine wiring parts B arranged at both other regions thereof, respectively, like the fourth wiring layer 24.

Likewise, the metal plane layer PL is arranged in the region corresponding to the fine wiring parts A of the fifth and sixth wiring layers 25, 26, and the metal plane layer PL is not arranged in the regions corresponding to the non-fine wiring parts B of the fifth wiring layer 25.

Further, the fifth insulation layer 35 having the fifth via holes VH5 reaching the fifth and sixth wiring layers 25, 26 is formed on the fourth insulation layer 34. The connection pad CP, which is connected to the fifth and sixth wiring layers 25, 26 via the fifth via conductors VC5 in the fifth via holes VH5, is formed on the fifth insulation layer 35, as the seventh wiring layer.

Referring to the place denoted with the symbol S in the partial enlarged sectional view of FIG. 13, the via receiving pad VP of the fifth wiring layer 25 is stacked on the connection part of the fourth wiring layer 24 via the third via conductors VC3. Further, the connection pad CP is stacked on the via receiving pad VP of the fifth wiring layer 25 via the fifth via conductors VC5.

In this way, the two-stage stacked via structure is established by the third via conductors VC3 and the fifth via conductors VC5 above and below the via receiving pad VP of the fifth wiring layer 25.

As described above, the metal plane layer PL is arranged only in the region corresponding to the fine wiring part A of each of the fourth wiring layer 24 and fifth and sixth wiring layers 25, 26. Thereby, in the process of forming the metal plane layer PL, the via receiving pad for establishing the stacked via structure is omitted.

Instead, the third via holes VH3 penetrating the fourth insulation layer 34 and third insulation layer 33 arranged above and below the metal plane layer PL are formed, and the via receiving pad VP of the fifth wiring layer 25 is formed on the fourth insulation layer 34 formed on the metal plane layer PL.

In this way, even when the metal plane layer PL is inserted between the fourth wiring layer 24 and the fifth and sixth wiring layers 25, 26, the number of stacked layers of the stacked via structure is not increased. For this reason, even when the metal plane layer PL is additionally formed, it is possible to secure the reliability of electrical connection of the stacked via structure.

Also, in the process of forming the metal plane layer PL, the batch pattern is simply formed without forming the fine pattern such as the via receiving pad for the stacked via structure. Therefore, it is possible to adopt the simple method such as the subtractive method.

Therefore, contrary to the process of forming the fine fourth wiring layer 24 and the fifth and sixth wiring layers 25, 26, it is not necessary to use the semi additive method of which the technical difficulty level is high. Thus, even though the metal plane layer PL is additionally formed, there is no fear that the manufacturing yield is decreased.

Also, since it is possible to form the metal plane layer PL by the simple method such as the subtractive method, it is possible to reduce the manufacturing cost, as compared to a configuration where the semi additive method for fine wiring formation is used.

As shown in the partial enlarged sectional view of FIG. 13, the third insulation layer 33 between the fourth wiring layer 24 and the metal plane layer PL is formed as a thin film having a thickness T1 of about 2 μm. Likewise, the fourth insulation layer 34 between the metal plane layer PL and the fifth and sixth wiring layers 25, 26 is also formed as a thin film having a thickness T2 of about 2 μm.

Thereby, since each fine wiring part A of the fourth wiring layer 24 and the fifth and sixth wiring layers 25, 26 is formed to be sufficiently close to the metal plane layer PL, it is possible to sufficiently secure the effect of suppressing the crosstalk.

Also, the metal plane layer PL is not formed with the via receiving pad for the stacked via structure. For this reason, the fourth wiring layer 24 and the fifth wiring layer 25 are connected to each other via the third via conductors VC3 in the third via holes VH3 penetrating the third and fourth insulation layers 33, 34 arranged above and below the metal plane layer PL.

Also, the metal plane layer PL is connected to the sixth wiring layer 26 of the upper side via the fourth via conductors VC4 in the fourth via holes VH4 formed in the fourth insulation layer 34 on the metal plane layer PL.

In this way, a depth (thickness: T2) of the fourth via hole VH4 connecting the metal plane layer PL and the sixth wiring layer 26 is smaller than a depth (thickness: T3) of the third via hole VH3 connecting the fourth wiring layer 24 and the fifth wiring layer 25.

Figure 15:
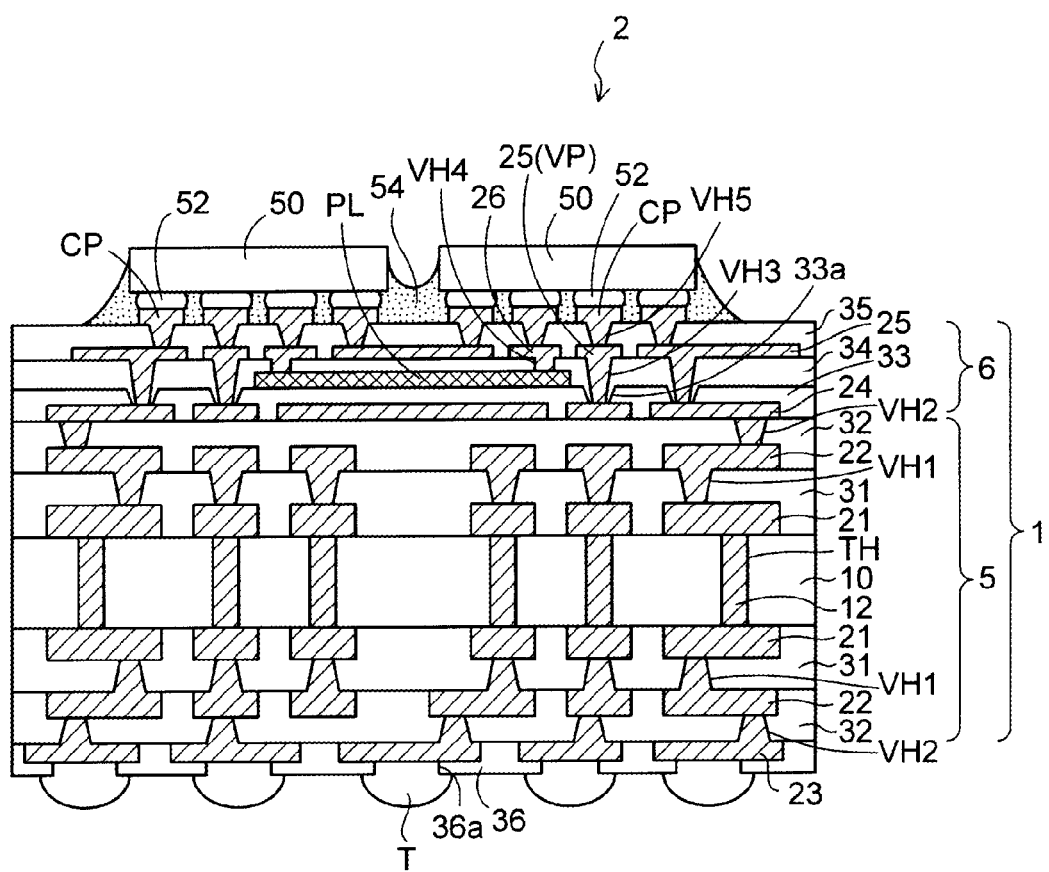
FIG. 15 is a sectional view illustrating a semiconductor device according to an exemplary embodiment.

In FIG. 15, a semiconductor device 2 using the wiring substrate 1 shown in FIG. 13 is shown. As shown in FIG. 15, the wiring substrate 1 of FIG. 13 is provided with a plurality of semiconductor device mounting parts, and connection terminals 52 of a plurality of semiconductor devices 50 are flip chip-connected to the connection pad CP of the upper surface-side via a soldering.

The fourth wiring layer 24 or fifth wiring layer 25 of the wiring substrate 1 is formed to have wirings for connecting the plurality of semiconductor devices 50 each other. Further, an under fill resin 54 is filled between the plurality of semiconductor devices 50 and the wiring substrate 1.

As the plurality of semiconductor devices 50, a plurality of logic chips such as a CPU and the like may be mounted or a logic chip and a memory chip may be mounted.

Further, solder balls are mounted to the third wiring layer 23 of the lower surface-side of the wiring substrate 1, so that external connection terminals T are formed.

By the above, the semiconductor device 2 of the exemplary embodiment is obtained. In the semiconductor device 2 of the exemplary embodiment, the semiconductor devices 50 are connected to the second multi-layered wiring layer 6 having the fine wirings, and the pitch is converted so that the wiring pitch is widened by the first multi-layered wiring layer 5.

The external connection terminals T of the semiconductor device 2 are connected to connection parts of a mounting substrate such as a motherboard. Since the second multi-layered wiring layer 6 can be formed to have the narrow pitch, it can be used as the mounting substrate of the high performance semiconductor devices 50. Also, since the crosstalk is suppressed by the metal plane layer PL, it is possible to improve the reliability.

In the meantime, the wiring substrate 1 of the semiconductor device 2 shown in FIG. 15 is formed with the metal plane layer PL of one layer. However, the number of layers of the metal plane layer PL may be arbitrarily formed depending on the number of stacked layers of the fine wiring.

Figure 16:
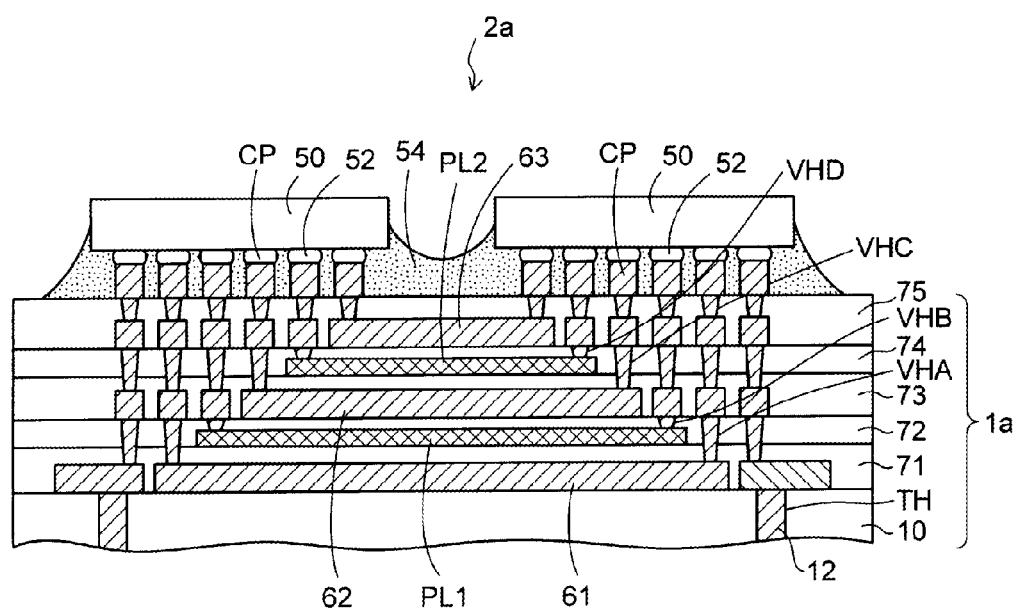
FIG. 16 is a partial sectional view illustrating another semiconductor device according to an exemplary embodiment.

FIG. 16 illustrates an example where a wiring substrate 1a of a semiconductor device 2a is formed with two metal plane layers PL. A first metal plane layer PL1 is formed on a first wiring layer 61 via a first insulation layer 71. A second wiring layer 62 is formed on the first metal plane layer PL1 via a second insulation layer 72.

Further, a second metal plane layer PL2 is formed on the second wiring layer 62 via a third insulation layer 73. A third wiring layer 63 is formed on the second metal plane layer PL2 via a fourth insulation layer 74.

A connection pad CP is formed on the third wiring layer 63 via a fifth insulation layer 75. Connection terminals 52 of the semiconductor devices 50 are flip chip-connected to the connection pad CP. Further, an under fill resin 54 is filled between the semiconductor devices 50 and the wiring substrate 1a.

In this way, the first metal plane layer PL1 is formed between the first wiring layer 61 and the second wiring layer 62. Also, the second metal plane layer PL2 is formed between the second wiring layer 62 and the third wiring layer 63.

The connection aspects of a first via hole VHA and a second via hole VHB connecting the first wiring layer 61, the first metal plane layer PL1 and the second wiring layer 62 are the same as the partial enlarged sectional view of FIG. 13.

Also, the connection aspects of a third via hole VHC and a fourth via hole VHD connecting the second wiring layer 62, the second metal plane layer PL2 and the third wiring layer 63 are the same as the partial enlarged sectional view of FIG. 13.

In FIG. 16, the respective openings of the first insulation layer 71 and the third insulation layer 73 corresponding to the openings 33a of the third insulation layer 33 of FIG. 13 are omitted.

In the wiring substrate 1a of the semiconductor device 2a shown in FIG. 16, the first wiring layer 61, the second wiring layer 62 and the third wiring layer 63 have the fine wiring part A and the non-fine wiring parts B (not shown), respectively, like the wiring substrate 1 of FIG. 13. The first and second metal plane layers PL1, PL2 are arranged only in the regions corresponding to the respective fine wiring parts A.

Also, when forming the first and second metal plane layers PL1, PL2, the via receiving pad for the stacked via structure is omitted.

For this reason, even when the plurality of metal plane layers is inserted, the number of stacked layers of the stacked via structure is not increased, so that the reliability of connection can be secured. Also, as described above, since it is not necessary to form the fine wiring in the process of forming the metal plane layers, the metal plane layers can be formed with high yield by the simple method.

Like this, since the formation of the metal plane layers does not decrease the yield, even when the plurality of metal plane layers is additionally formed, the decrease in the yield is avoided.

[Clauses]

This disclosure further encompasses various exemplary embodiments, for example, described below.

1. A method of manufacturing a wiring substrate, the method comprising:
preparing a wiring member comprising a first wiring layer including a first wiring part having a first wiring interval and a second wiring part having a second wiring interval wider than the first wiring interval;
forming a first insulation layer having an opening arranged on a connection part of the first wiring layer;
forming a metal plane layer on a portion of the first insulation layer, the first wiring part being located below the portion;
forming a second insulation layer including a first via hole and a second via hole on the first insulation layer and the metal plane layer, the first via hole being arranged in the opening of the first insulation layer and the second via hole being arranged on the metal plane layer, and
forming a second wiring layer and a third wiring layer on the second insulation layer, the second wiring layer being connected to the first wiring layer via a first via conductor in the first via hole, and the third wiring layer being connected to the metal plane layer via a second via conductor in the second via hole.

2. The method according to claim 1, wherein in the process of forming the second insulation layer, the first via hole is arranged at an inner side of the opening of the first insulation layer.

3. The method according to claim 1, further comprising:
after the process of forming the second wiring layer and the third wiring layer,
forming a third insulation layer on the second wiring layer and the third wiring layer;
forming a third via hole reaching the second wiring layer in the third insulation layer; and
forming a fourth wiring layer on the third insulation layer, the fourth wiring layer being connected to the second wiring layer via a third via conductor in the third via hole,
wherein the second wiring layer is a via receiving pad, and a stacked via structure is established by the first via conductor and the third via conductor arranged above and below the second wiring layer.

4. The method according to claim 1, wherein in the process of preparing the wiring member, the wiring member comprises a first multi-layered wiring layer below the first wiring layer,
wherein a second multi-layered wiring layer comprises the first wiring layer, the metal plane layer, the second wiring layer and the third wiring layer, and
wherein the second multi-layered wiring layer has a wiring pitch narrower than the first multi-layered wiring layer.

5. The method according to claim 1, wherein a semi additive method of removing a seed layer by an anisotropic dry etching is used in the process of forming the first wiring layer and the process of forming the second wiring layer and the third wiring layer, and
wherein the process of forming the metal plane layer comprises:
forming a metal layer on the first insulation layer,
patterning the metal layer, and
forming a metal plated layer on the patterned metal layer by an electroless plating.

6. The method according to claim 1, wherein the wiring substrate is provided with a plurality of semiconductor device mounting parts, and
wherein the first wiring layer or the second wiring layer has wirings for connecting a plurality of semiconductor devices each other.

What is claimed is:
1. A wiring substrate, comprising:
a first wiring layer including a first wiring part having a first wiring interval and a second wiring part having a second wiring interval wider than the first wiring interval;
a first insulation layer formed on the first wiring layer;
a metal plane layer formed on a portion of the first insulation layer, the first wiring part being located below the portion;
a second insulation layer formed on the first insulation layer and the metal plane layer;
a first via hole extending from an upper surface of the second insulation layer to the first wiring layer;
a first via conductor formed in the first via hole;
a second via hole formed in the second insulation layer and reaching the metal plane layer;
a second via conductor formed in the second via hole;
a second wiring layer formed on the second insulation layer and connected to the first wiring layer via the first via conductor;
a third wiring layer formed on the second insulation layer and connected to the metal plane layer via the second via conductor;
a first multi-layered wiring layer; and
a second multi-layered wiring layer formed on the first multi-layered wiring layer and having a wiring pitch narrower than the first multi-layered wiring layer, and
wherein the second multi-layered wiring layer comprises the first wiring layer, the metal plane layer, the second wiring layer and the third wiring layer.

2. The wiring substrate according to claim 1, wherein the first insulation layer is formed with an opening in a region in which the first via hole is arranged, and
wherein the first via hole is arranged at an inner side of the opening of the first insulation layer.

3. The wiring substrate according to claim 1, further comprising:
a third insulation layer formed on the second wiring layer;
a third via hole formed in the third insulation layer and reaching the second wiring layer;
a third via conductor formed in the third via hole; and
a fourth wiring layer formed on the third insulation layer and connected to the second wiring layer via the third via conductor,
wherein the second wiring layer is a via receiving pad, and a stacked via structure is established by the first via conductor and the third via conductor arranged above and below the second wiring layer.

4. The wiring substrate according to claim 1, wherein a depth of the second via hole is smaller than a depth of the first via hole.

5. The wiring substrate according to claim 1, wherein the wiring substrate is provided with a plurality of semiconductor device mounting parts, and wherein the first wiring layer or the second wiring layer has wirings for connecting a plurality of semiconductor devices to each other.

6. The wiring substrate according to claim 2, wherein the second insulation layer is filled within the opening of the first insulation layer, and the first via hole penetrates the second insulation layer within the opening.

* * * * *